United States Patent
Lee et al.

(10) Patent No.: US 8,359,501 B1
(45) Date of Patent: *Jan. 22, 2013

(54) MEMORY BOARD WITH SELF-TESTING CAPABILITY

(75) Inventors: Hyun Lee, Ladera Ranch, CA (US);
Jayesh R. Bhakta, Cerritos, CA (US);
Soonju Choi, Irvine, CA (US)

(73) Assignee: Netlist, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/183,253

(22) Filed: Jul. 14, 2011

Related U.S. Application Data

(63) Continuation of application No. 12/422,925, filed on Apr. 13, 2009, now Pat. No. 8,001,434.

(60) Provisional application No. 61/044,801, filed on Apr. 14, 2008, provisional application No. 61/044,825, filed on Apr. 14, 2008, provisional application No. 61/044,839, filed on Apr. 14, 2008.

(51) Int. Cl.
*G11C 29/00* (2006.01)

(52) U.S. Cl. ......................... 714/719; 714/718

(58) Field of Classification Search .................. 714/718, 714/719, 736, 733, 734, 738, 819; 365/201
See application file for complete search history.

(56) References Cited

U.S. PATENT DOCUMENTS

| | | | |
|---|---|---|---|
| 3,660,675 A | 5/1972 | Andrews, Jr. | |
| 3,757,235 A | 9/1973 | McCormick et al. | |
| 4,305,091 A | 12/1981 | Cooper | |
| 4,586,168 A | 4/1986 | Adlhoch et al. | |
| 4,701,845 A | 10/1987 | Andreasen et al. | |
| 4,752,741 A | 6/1988 | Kim et al. | |
| 4,782,487 A | 11/1988 | Smelser | |
| 4,837,743 A | 6/1989 | Chiu et al. | |
| 4,885,799 A | 12/1989 | Van Horn | |
| 4,903,266 A | 2/1990 | Hack | |
| 4,910,597 A | 3/1990 | Harada et al. | |
| 4,942,556 A | 7/1990 | Sasaki et al. | |
| 4,958,346 A * | 9/1990 | Fujisaki ........................ 714/720 |
| 4,987,321 A | 1/1991 | Toohey | |
| 5,033,048 A | 7/1991 | Pierce et al. | |
| 5,051,997 A | 9/1991 | Sakashita et al. | |
| 5,138,619 A | 8/1992 | Fasang et al. | |
| 5,173,906 A | 12/1992 | Dreibelbis et al. | |

(Continued)

OTHER PUBLICATIONS

Der-Chang et al. "*A parallel built-in self-diagnostic method for embedded memory arrays*", IEEE Transactions on Computer-Aided Design of Integrated Circuits and Systems, Apr. 2002, vol. 21, Issue 4, pp. 449-465.

(Continued)

*Primary Examiner* — Phung M Chung

(57) ABSTRACT

A self-testing memory module includes a printed circuit board configured to be operatively coupled to a memory controller of a computer system and includes a plurality of memory devices on the printed circuit board, each memory device of the plurality of memory devices comprising data, address, and control ports. The memory module also includes a control module configured to generate address and control signals for testing the memory devices. The memory module includes a data module comprising a plurality of data handlers. Each data handler is operable independently from each of the other data handlers of the plurality of data handlers. Each data handler is operatively coupled to a corresponding plurality of the data ports of one or more of the memory devices and is configured to generate data for writing to the corresponding plurality of data ports.

20 Claims, 5 Drawing Sheets

U.S. PATENT DOCUMENTS

| | | | |
|---|---|---|---|
| 5,222,066 A | 6/1993 | Grula et al. | |
| 5,241,503 A | 8/1993 | Cheng | |
| 5,304,856 A | 4/1994 | Rainal | |
| 5,337,254 A | 8/1994 | Knee et al. | |
| 5,359,235 A | 10/1994 | Coyle et al. | |
| 5,394,037 A | 2/1995 | Josephson et al. | |
| 5,430,335 A | 7/1995 | Tanoi | |
| 5,525,917 A | 6/1996 | Wong et al. | |
| 5,841,296 A | 11/1998 | Churcher et al. | |
| 5,914,543 A | 6/1999 | Scherpenberg et al. | |
| 6,000,048 A | 12/1999 | Krishna et al. | |
| 6,044,481 A | 3/2000 | Kornachuk et al. | |
| 6,070,217 A | 5/2000 | Connolly et al. | |
| 6,169,696 B1 | 1/2001 | Bissey | |
| 6,194,959 B1 | 2/2001 | Kamoshida et al. | |
| 6,216,240 B1 | 4/2001 | Won et al. | |
| 6,467,056 B1 | 10/2002 | Satou et al. | |
| 6,560,740 B1 | 5/2003 | Zuraski, Jr. et al. | |
| 6,614,702 B2 | 9/2003 | Lee | |
| 6,681,358 B1 * | 1/2004 | Karimi et al. | 714/733 |
| 6,721,150 B1 | 4/2004 | Guerrero, Jr. | |
| 6,812,869 B1 | 11/2004 | Rahman et al. | |
| 6,829,728 B2 | 12/2004 | Cheng et al. | |
| 6,910,162 B2 * | 6/2005 | Co et al. | 714/718 |
| 6,918,072 B2 | 7/2005 | Cowles et al. | |
| 6,928,024 B2 | 8/2005 | Pfeiffer et al. | |
| 6,928,593 B1 | 8/2005 | Halbert et al. | |
| 6,930,509 B2 | 8/2005 | Banik | |
| 6,934,900 B1 | 8/2005 | Cheng et al. | |
| 7,036,064 B1 | 4/2006 | Kebichi et al. | |
| 7,053,470 B1 | 5/2006 | Sellers et al. | |
| 7,062,696 B2 | 6/2006 | Barry et al. | |
| 7,184,915 B2 | 2/2007 | Hansquine et al. | |
| 7,190,210 B2 | 3/2007 | Azrai et al. | |
| 7,203,873 B1 | 4/2007 | Adams | |
| 7,253,652 B2 | 8/2007 | Azimi et al. | |
| 7,284,166 B2 | 10/2007 | Zappa et al. | |
| 7,774,667 B2 * | 8/2010 | Saito et al. | 714/733 |
| 2001/0048342 A1 | 12/2001 | Yoshida et al. | |
| 2002/0000847 A1 | 1/2002 | Taguchi | |
| 2002/0131535 A1 | 9/2002 | Huber | |
| 2002/0140523 A1 | 10/2002 | Park et al. | |
| 2003/0098742 A1 | 5/2003 | Nakagawa et al. | |
| 2003/0126346 A1 | 7/2003 | Kuo | |
| 2003/0197797 A1 | 10/2003 | Segura | |
| 2003/0218491 A1 | 11/2003 | Nagasue | |
| 2004/0155702 A1 | 8/2004 | Danielsson | |
| 2004/0199843 A1 | 10/2004 | Hansquine et al. | |
| 2005/0093620 A1 | 5/2005 | Ho et al. | |
| 2005/0127989 A1 | 6/2005 | Miyagi | |
| 2005/0289423 A1 | 12/2005 | Yabuta | |
| 2006/0082383 A1 | 4/2006 | Choi | |
| 2006/0107156 A1 | 5/2006 | Lee et al. | |
| 2006/0140015 A1 | 6/2006 | Kasamsetty | |
| 2006/0144015 A1 | 7/2006 | Cash et al. | |
| 2006/0147217 A1 | 7/2006 | Hahin et al. | |
| 2006/0192653 A1 | 8/2006 | Atkinson et al. | |
| 2006/0242458 A1 | 10/2006 | Feldman et al. | |
| 2006/0262586 A1 | 11/2006 | Solomon et al. | |
| 2006/0271748 A1 | 11/2006 | Jain et al. | |
| 2007/0030814 A1 | 2/2007 | Shin et al. | |
| 2007/0058471 A1 | 3/2007 | Rajan et al. | |
| 2007/0079199 A1 | 4/2007 | Chorn et al. | |
| 2007/0109707 A1 | 5/2007 | Honda | |
| 2007/0152743 A1 | 7/2007 | Keeth et al. | |
| 2007/0204075 A1 | 8/2007 | Rajan et al. | |
| 2007/0223296 A1 | 9/2007 | Miller et al. | |

OTHER PUBLICATIONS

Bayard "On the LTI properties of adaptive feed forward systems with tapdelay-line regressors", IEEE Transactions on Signal Processing, May 1999, vol. 47, Issue 5, pp. 1288-1296.

Mutoh et al. "EMI Noise controlling methods suitable for electric vehicle drive systems", Industrial Electronics Society, 2004, IECON 2004, Nov. 2-6, 2004, vol. 1, pp. 963-968.

Sekiguchi et al "Low-noise, high-speed datat transmission using a ringing-canceling output buffer", IEEE Journal of Solid-State Circuits, Dec. 1995, vol. 30, Issue 12, pp. 1569-1574.

* cited by examiner

MEMORY BOARD WITH SELF-TESTING CAPABILITY

CROSS-REFERENCE TO RELATED APPLICATIONS

The present application is a continuation of U.S. patent application Ser. No. 12/422,925, filed Apr. 13, 2009, now U.S. Pat. No. 8,001,434, which claims the benefit of priority from US. Provisional Application No. 61/044,801, filed Apr. 14, 2008, US. Provisional Application No. 61/044,825, filed Apr. 14, 2008, and US. Provisional Application No. 61/044,839, filed Apr. 14, 2008. Each of the foregoing applications is incorporated in their entirety by reference herein. This application is related to U.S. patent application Ser. No. 12/422,912, filed on Apr. 13, 2009 and entitled "Self-Adjusting Damper", which is still pending at the United States Patent and Trademark Office, and to U.S. application Ser. No. 12/422,853, filed on Apr. 13, 2009, and entitled "Circuit Providing Load Isolation and Noise Reduction", now U.S. Pat. No. 8,154,901, both of which are incorporated in their entirety by reference herein.

BACKGROUND

1. Field

The present invention relates to self-testing electronic modules and, more particularly, to self-testing electronic memory modules.

2. Description of the Related Art

The failure of memory components in an electronic system may result in the loss of valid data. Therefore, it is important to ensure proper memory operation in an electronic system. Memory integrated circuits ("memory chips") often go through a series of tests at various stages of system manufacture. Once memory chips are deployed in a system, they also generally go through a system level memory test each time the system is booted. In addition, memory chips may undergo a parity checking process during normal system operation.

There are typically at least three test phases which memories undergo during system manufacture. Each phase generally tests for memory defects and for the correct operation of the input/output interface. The first test phase is typically conducted by the memory chip manufacturer and generally involves checking for bit failures, correct memory access speed, etc. The second test phase is typically done by memory module manufacturers and generally involves testing the signal quality, the noise susceptibility, and the operational speed of the memory module as a single unit. The second test phase may also include checking for bit failures in individual memory chips. The third phase is usually carried out by the system manufacturer. During the third phase, the interaction of the memory subsystem with other components in the system is tested. During the third phase, the individual memory module operation is also tested again and the memory array is checked for defects. Because of the significant amount of testing that memories undergo during the manufacturing process, there is generally substantial test cost and test time associated with ensuring the proper memory operation. This test cost and test time translate into an increase in system cost and a decrease in system performance.

There are a number of memory test methodologies that employ either external test hardware, embedded self-test logic ("MBIST"), or both. However, the usefulness of these test methodologies is limited due to the high cost and other limitations associated with them. For instance, external test hardware such as automatic test equipment ("ATE") is very expensive. Moreover, the development time and cost associated with implementing MBIST is relatively high. These costs and limitations are especially significant when testing dynamic random access memory ("DRAM"). For example, technological developments, such as increases in DRAM speed, may require manufacturers to upgrade ATE machines relatively frequently. In addition, MBIST in DRAM chips generally cannot be fully utilized for system level testing of memory boards.

Because of the increasing cost, complexity, and time involved with fully testing DRAM chips, DRAM manufacturers often provide "effectively tested" ("ETT") DRAM chips to memory module manufacturers at a lower price rather than providing fully tested DRAM chips. Memory module manufacturers often prefer the ETT DRAM chips mainly due to their greater availability. Memory module manufacturers who receive ETT DRAM chips then have to assume a part of the responsibility of validating the DRAM chips, adding to the complexity of the memory module test process.

SUMMARY

In certain embodiments, a self-testing memory module is provided comprising a printed circuit board configured to be operatively coupled to a memory controller of a computer system. The memory module may further comprise a plurality of memory devices on the printed circuit board. Each memory device of the plurality of memory devices comprises data, address, and control ports. In certain embodiments, the memory module includes a control module configured to generate address and control signals for testing the memory devices and a data module comprising a plurality of data handlers. Each data handler in certain embodiments is operable independently from each of the other data handlers of the plurality of data handlers. Each data handler may be operatively coupled to a corresponding plurality of the data ports of one or more of the memory devices and configured to generate data for writing to the corresponding plurality of data ports.

A self-testing memory module is provided in certain embodiments comprising a printed circuit board configured to be operatively coupled to a memory controller of a computer system. The memory module may further comprise a plurality of memory devices on the printed circuit board. Each memory device of the plurality of memory devices comprises data, address, and control ports in some embodiments. The memory module of certain embodiments includes a control module configured to generate address and control signals for testing the memory devices. In certain embodiments, the memory module comprises a data module comprising at least one data handler operatively coupled to a corresponding plurality of the data ports of one or more of the memory devices and configured to generate cyclic data for writing to the corresponding plurality of data ports.

In certain embodiments, a method of self-testing a memory module includes providing a self-testing memory module. The memory module comprises a printed circuit board configured to be operatively coupled to a memory controller of a computer system. The memory module further comprises a plurality of memory devices on the printed circuit board. Each memory device of the plurality of memory devices comprising data, address, and control ports. In certain embodiments, the memory module comprises a control module configured to generate address and control signals for testing the memory devices. The memory module may further comprise a data module comprising a plurality of data handlers. Each data handler may be operable independently from each of the other data handlers of the plurality of data handlers and operatively coupled to a corresponding plurality of the data ports. The method of certain embodiments further includes generating, by each of the data handlers, data for writing to the corresponding plurality of data ports.

DETAILED DESCRIPTION

Figure 1:
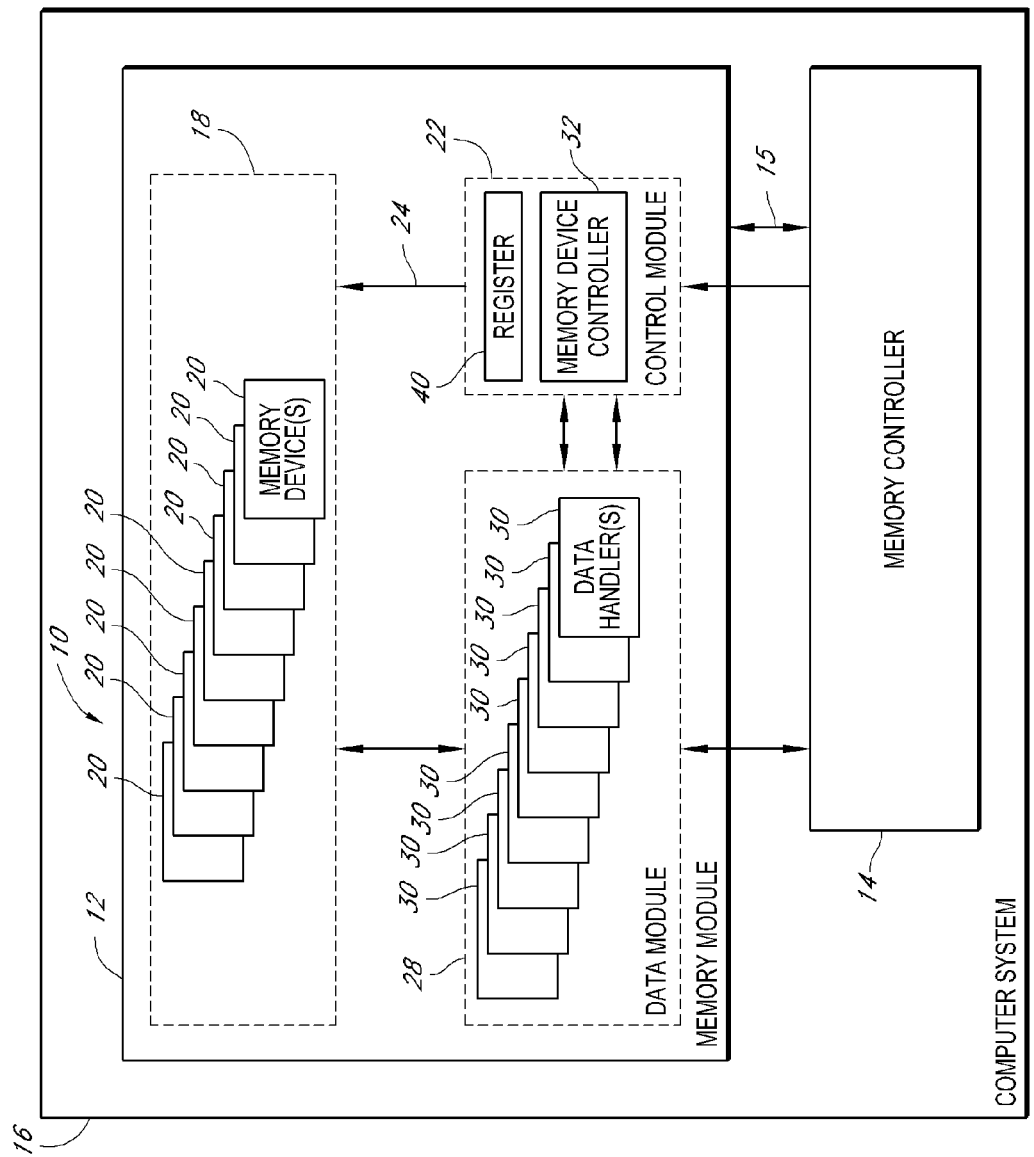
FIG. 1 is a block diagram of an example self-testing memory module in accordance with certain embodiments described herein.

Certain embodiments described herein present a self-testing electronic system, such as for example, a self-testing electronic memory module. Some embodiments described herein present a self-testing memory module that is populated with ETT DRAM chips. Certain embodiments described herein present a self-testing registered dual in-line memory module ("RDIMM"). Some embodiments described herein present a self-testing RDIMM that does not require any additional pins other than the pins on the standard JEDEC RDIMM connector. For example, the memory module may utilize the address and control signals (e.g., address and control signals generated by the memory module to test the memory module) along with a test signal to enable and execute a self testing function.

Certain embodiments described herein present a self-testing memory module that includes a control module and a data module which can generate memory addresses and data according to the JEDEC standard memory protocol.

Some embodiments described herein presents a self-testing memory module that can be configured through an I²C interface and that allows test results to be read out through the I²C interface. Certain embodiments described herein present a self-testing memory module that allows a test function to be configured, controlled, and/or executed without substantial system memory controller involvement. Some embodiments present a self-testing memory module that can be tested without any external test equipment. For example, certain embodiments present a self-testing memory module that can be tested without any system driven test procedure. Various embodiments described herein present a self-testing memory module that can be self-tested at a target system speed. Certain embodiments described herein present a self-testing memory module that can generate data (DQ) and data-strobe (DQS) signals with wave characteristics that resemble the wave characteristics of DQ and DQS signals from a system memory controller.

MBIST is commonly used to test memories embedded in application specific integrated circuits ("ASICs") or system on chip integrated circuits ("SoCs") such as, for example, advanced memory buffers ("AMBs"). The MBIST implementation usually includes three distinct functional blocks: the address/control generator, the data generator/checker (sometimes referred to as a signature analyzer), and the test interface controller/register ("JTAG"). The test instructions and test patterns are generally loaded to the address/control generator and the data generator/checker through the JTAG interface. The test results are generally read out through the JTAG interface.

In memory module applications, there are obstacles associated with using MBIST. One of these obstacles is the large number of signals used to interface the three MBIST functional blocks. The inter-block timing constraints can present another obstacle. In addition, the ability to control the test is limited. For example, synchronizing the address/or control signals with the data signal can be difficult. The relatively large amount of information to be gathered and stored while testing the memory presents yet another obstacle.

Unlike on an ASIC, in which the three MBIST functional blocks are in a single chip, the MBIST functional blocks on a memory module generally would be segregated into multiple chips on the memory module due to physical and electrical limitations and requirements. This makes implementing MBIST on a memory module difficult because, while there is virtually no limit on the number of available interface signals among the three MBIST functional blocks in an ASIC, the memory module can support only a limited amount of interface signals between memory chips. In addition, because the MBIST functional blocks are spread out to multiple chips on a memory module, the inter-block signal delay is generally much longer on a memory module than on an ASIC. It is also generally not feasible to implement cross-checking logic that operates the three MBIST functional blocks in lock-operational block. This is due to the limitation on the number of interface signals and to the relatively long inter-block signal delay time on a memory module versus on an ASIC.

In some cases such as where a memory module includes an AMB, the self-test logic (MBIST) implemented in the AMB includes command and address generation logic in addition to a data generator and checker. Each of these functional blocks may be implemented on a single physical AMB device (e.g., a single integrated circuit package). However, because all of the self-test command, address and data signals are combined in one physical area of the memory module, a memory module (e.g., DIMM) level routing problem can occur, making it difficult to route the self-test signals on the memory module and resulting in performance degradation and/or implementation difficulty. In addition, the data width of self-test logic of the memory module will be limited to the data width of the AMB (e.g., to the data width of the self-test logic implemented on the AMB, to the number of available ports on the AMB, etc.). As such, implementing memory module test logic on an AMB is not flexible (e.g., to changes in the data width of the memory module) and generally supports only memory modules having certain predetermined, fixed data widths.

Finally, in most cases, since an ASIC cannot be repaired, the ASIC MBIST is generally only capable of detecting and reporting the pass/fail status of memory tests. For memory module test results, on the other hand, it is generally advantageous to include both addresses of the memory locations where failures occur and the data patterns that were read back from the failed memory locations. This type of reporting can help to facilitate the repair of the memory module by, for example, allowing for the identification and replacement of failed components.

FIG. 1 is a block diagram of an example self-testing memory module 10 in accordance with certain embodiments described herein. The memory module 10 includes a printed circuit board 12 configured to be operatively coupled to a memory controller 14 of a computer system 16. The memory module 10 further includes a plurality of memory devices 18 on the printed circuit board (PCB) 12, each memory device 20 of the plurality of memory devices 18 comprising data, address, and control ports. The memory module 10 comprises a control module 22 configured to generate address and control signals 24 for testing the memory devices 18. The memory module 10 also includes a data module 28 comprising a plurality of data handlers 30. Each data handler 30 is operable independently from each of the other data handlers 30 of the plurality of data handlers 28 and is operatively coupled to a corresponding plurality of the data ports of one or more of the plurality of memory devices 18. For example, each of the data handlers 30 may be operatively coupled to (e.g., logically and/or electrically coupled to) the corresponding plurality of data ports. Each data handler 30 is further configured to generate data for writing to the corresponding plurality of data ports. The memory module 10 may further include an I²C interface 15 in certain embodiments.

As described more fully below, in certain embodiments the data module 28 generates test data patterns to write to the plurality of memory devices 18 of the memory module 12 and checks the data patterns read or received back from the plurality of memory devices 18 for agreement with corresponding data patterns that are expected to be read back from the plurality of memory devices 18. For example, in one embodiment, the data module 28 generates cyclic patterns to write to the plurality of memory devices 18. In some embodiments, the data module 18 also isolates the data path from the system board of the computer system 16 to the plurality of memory devices 18 while the memory module 10 is not accessed by the computer system 16. For example, the data module 28 may isolate the data path from the system board to the plurality of memory devices 18 when the memory module 10 is in a self-testing mode. The control module 22 may include, for example, a dual input register (e.g., the memory device controller 32 described more fully below) for registering address and control signals coming from either self-testing logic (e.g., from the test controller 36 described more fully below) or from the memory controller 14 on the system board. In some embodiments, during testing, the control module 22 generates address and control signals 24 associated with memory locations to be tested and the data module 28 generates corresponding test data patterns and provides them to the appropriate memory devices 20. For example, the data module 28 may receive a write command from the control module 22 and provide data to be written to certain locations in the memory devices 20 during a write operation. The data module 28 may then receive a read command to read back the data from those locations and check the read data for agreement with the expected data. If there is a mismatch between the read data and the expected data, the data module 28 may, for example, store the failure information (e.g., the failed data word) and inform the control module 22 about the failure. The control module may save the address of the memory location where the failure occurred.

In certain embodiments, the memory module 10 is configured to be operated in a test mode in which the control module 22 selectively inputs the address and control signals to the address and control ports of the plurality of memory devices 18. Moreover, in the test mode, each of the data handlers 30 write the data generated by the data handler 30 to the corresponding plurality of data ports by selectively inputting data signals to the data ports of the plurality of memory devices 18. The data module 28 and/or the control module 22 of certain embodiments are configured to test the plurality of memory devices 18 at the normal operating speed of the memory devices 20. For example, the data module 28 and/or the control module 22 are configured to provide memory signals (e.g., data, address and control signals) according the operating specification of the memory devices 20. In some embodiments, the control module 22 and the data module 28 produce memory addresses, control and/or data signals according to the JEDEC standard memory protocol. In some embodiments, for example, the control module 22 and the data module 28 generate the memory interface signals with proper edge relationships based on the JEDEC standard. In certain embodiments, the test speed, for example, may be defined by the speed of the clock (e.g., the system clock). The address sequences and/or the data patterns of certain embodiments may be programmable either through the I²C interface or they may be defaulted to pre-defined values.

In certain embodiments, data module 28 is configured to generate data signals with programmable slew rates and/or with variable peak values. In one embodiment, for example, the data module 28 is also able to generate data (DQ) and data-strobe (DQS) signals with programmable slew rates and programmable peak values so that the characteristics of the signals generated by the data module 28 generally correspond to the characteristics DQ and DQS signals generated by the system memory controller 14.

In some embodiments, the data module 28 and/or the control module 22 are configured to test the plurality of memory devices 18 under non-normal conditions. For example, the data module 28 and/or control module 22 may be configured to provide signals having frequencies which are higher or lower than the normal operating frequencies of the memory devices 20.

In certain embodiments, the memory module 10 has a memory capacity of 512-MB, 1-GB, 2-GB, 4-GB, or 8-GB. Other memory capacities are also compatible with certain embodiments described herein. In addition, memory modules 100 having widths of 4 bytes, 8 bytes, 16 bytes, 32 bytes, or 32 bits, 64 bits, 128 bits, 256 bits, as well as other widths (in bytes or in bits), are compatible with embodiments described herein. In certain embodiments, the PCB 12 has an industry-standard form factor. For example, the PCB 12 can have a low profile (LP) form factor with a height of 30 millimeters and a width of 133.35 millimeters. In certain other embodiments, the PCB 12 has a very high profile (VHP) form factor with a height of 50 millimeters or more. In certain other embodiments, the PCB 12 has a very low profile (VLP) form factor with a height of 18.3 millimeters. Other form factors including, but not limited to, small-outline (SO-DIMM), unbuffered (UDIMM), registered (RDIMM), fully-buffered (FBDIMM), mini-DIMM, mini-RDIMM, VLP mini-DIMM, micro-DIMM, and SRAM DIMM are also compatible with certain embodiments described herein. For example, in other embodiments, certain non-DIMM form factors are possible such as, for example, single in-line memory module (SIMM), multi-media card (MMC), and small computer system interface (SCSI).

In certain embodiments, the plurality of memory devices 18 of the memory module 10 may be arranged as ranks, each rank of memory generally having a bit width. In certain embodiments, each rank may comprise an independent set of memory devices 20 of the plurality of memory devices 18 that can be accessed by the memory controller 14 to access the full bit-width of the memory bus of the memory module 10. For example, a memory module 10 in which each rank of the memory module is 64 bits wide is described as having an "x 64" organization. Similarly, a memory module 10 having 72-bit-wide ranks is described as having an "x 72" organization. The number of memory devices 20 and corresponding memory capacity of a memory module 10 can be increased by increasing the number of memory devices 20 per rank or by increasing the number of ranks. For example, a memory module with four ranks with each rank having N 512-MB memory devices 20 has double the memory capacity of a memory module with two ranks with each rank having N 512-MB memory devices 20 and four times the memory capacity of a memory module with one rank with each rank having N 512-MB memory devices 20. During operation, the ranks of a memory module 10 may be selected or activated by control signals that are received from a component of the system (e.g., a system memory controller 14 or a local memory controller of the memory module 10). Examples of such control signals include, but are not limited to, rank-select signals, also called chip-select signals. In certain other embodiments, the memory module 10 comprises only one rank of memory devices 20.

As discussed, the PCB 12 may include at least one connector (not shown) configured to operatively couple the memory module 10 to the memory controller 14 of the computer system 16. The computer system 16 may include a host computer system. For example, the memory module is electrically coupled, logically coupled, or both, with the memory controller 14. Examples of host computer systems 108 include, but are not limited to, blade servers, 1U servers, personal computers (PCs), data storage systems and other applications in which space is constrained or limited. The memory controller 14 may comprise a disk controller of the computer system 16, for example. The memory controller 14 may be mounted on a system board of the host computer 16. The connector can comprise a plurality of edge connections which fit into a corresponding slot connector of the host system 16. The connector of certain embodiments provides a conduit for power voltage as well as data, address, and control signals between the memory module 10 and the host system 16. For example, the connector can comprise a standard DDR2, DDR3, and other future generation edge connectors. Additionally, in certain embodiments, more than one memory module 10 is coupled to the host system 16.

The plurality of memory devices 18 on the PCB 12 may include one or more volatile memory components. For example, the plurality of memory devices 18 of certain embodiments comprises two or more dynamic random-access memory (DRAM) elements 20. Types of DRAM devices 20 compatible with certain embodiments described herein include, but are not limited to, DDR, DDR2, DDR3, and synchronous DRAM (SDRAM). The memory devices 18 may comprise other types of memory elements such as static random-access memory (SRAM). In addition, volatile memory devices 20 having bit widths of 4, 8, 16, 32, as well as other bit widths, are compatible with certain embodiments described herein. Memory devices 20 compatible with certain embodiments described herein have packaging which include, but are not limited to, thin small-outline package (TSOP), ball-grid-array (BGA), fine-pitch BGA (FBGA), micro-BGA (µBGA), mini-BGA (mBGA), and chip-scale packaging (CSP). The plurality of memory devices 18 may further include one or more non-volatile memory devices 20, such as, for example, flash memories. The plurality of memory devices 18 of certain embodiments may include both volatile and non-volatile memory devices 20. For example, the plurality of memory devices 18 may include one or more of DRAM, SRAM, and/or flash memory devices in some embodiments.

Each data handler 30 is operable independently from each of the other data handlers 30 of the plurality of data handlers 28. For example, each data handler 30 is configured to write to and/or read from the corresponding plurality of data ports of one or more of the memory devices 20 without being in communication any of the other data handlers 30 or other data ports of the memory devices 20. As such, each data handler 30 can be used to generally independently test a portion of the memory space of the memory module 10. For example, each data handler 30 may be used to independently test one memory device 20 of the memory module 10. In such a configuration, the corresponding plurality of data ports of each data handler 30 may comprise each data port of the corresponding memory device 20. In other embodiments, each data handler 30 may be used to test a segment of one memory device 20, more than one memory device 20, segments more than one memory device 20, or any combination or sub-combination thereof. Because each of the data handlers 30 is operable independently of each of the other data handlers 30, the data handlers 30 are generally modular. As such, modifications in the configuration of the memory module 10 (e.g., changes in the bit-width of the memory bus, changes in the number of memory devices 20, etc.) may be less complicated to accommodate than in other types of self-testing memory modules 10. For example, where a new memory device 20 or set of memory devices 20 is added to the memory module 10, the change may be generally accommodated by adding a corresponding data handler 30. The change may be accommodated without having to implement a major reorganization of the memory module 10 or the self-testing logic of the memory module 10, for example.

Figure 2:
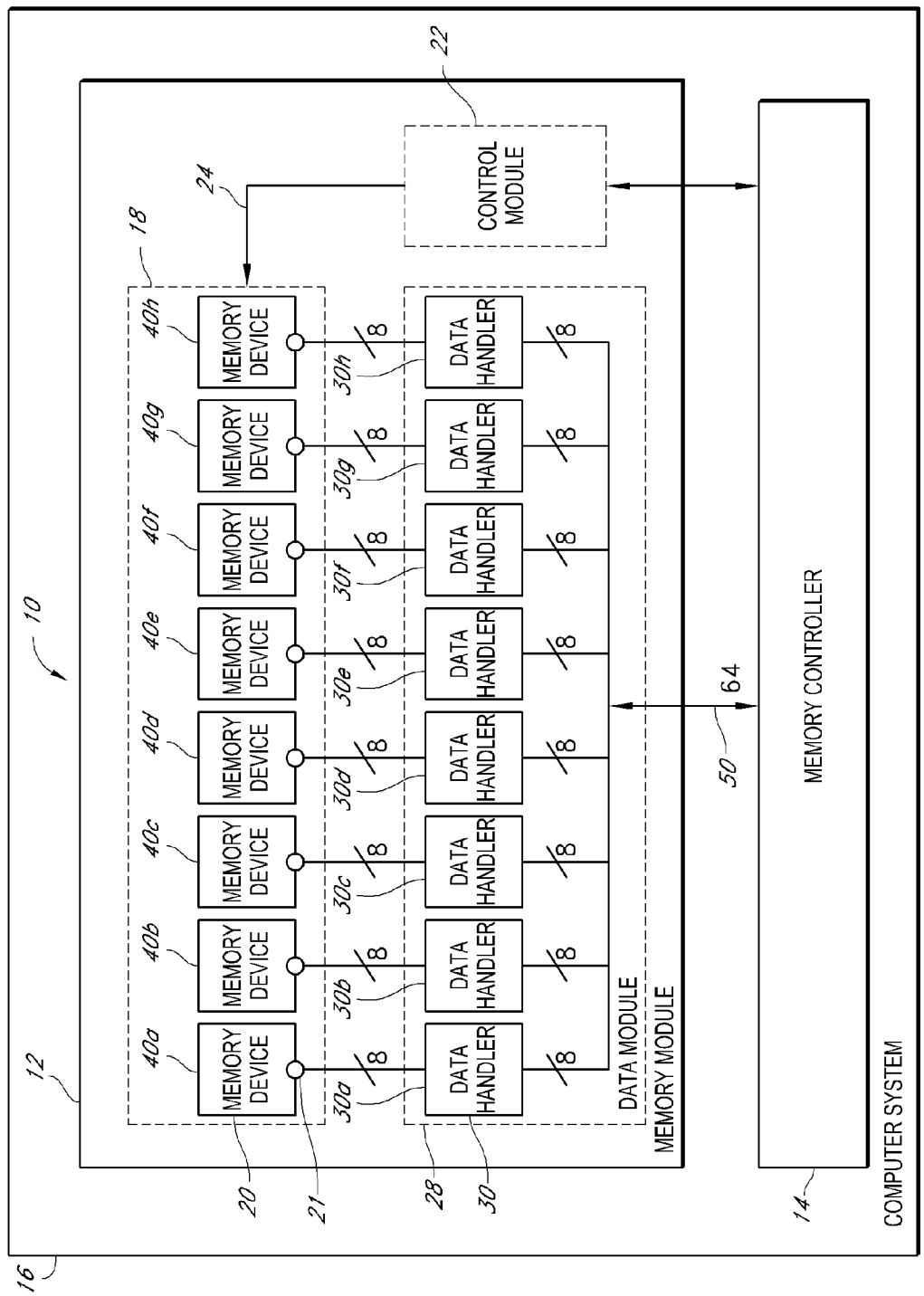
FIG. 2 is a block diagram of an example self-testing memory module including eight memory devices and eight data handlers in accordance with certain embodiments described herein.

Each data handler 30 is further configured to generate data for writing to the corresponding plurality of data ports. FIG. 2 is a block diagram of an example self-testing memory module 10 including eight memory devices 20 (e.g., memory devices 40a-40h) and a data module 28 comprising eight data handlers 30 (e.g., data handlers 30a-30h) in accordance with certain embodiments described herein. Each of the memory devices 20 includes an eight bit output data word and eight corresponding data ports. In addition, the system memory bus 50 between the memory controller 14 and the example memory module 10 is 64 bits wide and each of the data handlers 30 receives an eight bit segment of the system memory bus 50. Each of the data handlers 30 is operatively coupled to a corresponding plurality of data ports 21 of a corresponding one of the memory devices 20. As such, the data handlers 30 may be operatively coupled (e.g., electrically and/or logically coupled or connected) to the eight data ports 21 of one of the corresponding memory devices 20. For example, the data handler 30a may be operatively coupled to the eight data ports 21 of the memory device 40a of FIG. 2.

The configuration shown in FIG. 2 is for the purposes of illustration and is not intended to be limiting. For example, while the example memory module 10 of FIG. 2 includes an equal number of memory devices 20 and data handlers 30, other configurations are possible. In some configurations there are more memory devices 20 than data handlers 30 or vice versa. Moreover, the one or more data handlers 30 may be operatively coupled to a subset of the data ports 21 of one the memory devices 20 instead of all of the data ports 21 of one of the memory devices 20. In other embodiments, one or more data handlers 30 may be operatively coupled to a subset or all of the data ports 21 of more than one of the memory devices 20. For example, in one embodiment, each of the data handlers 30 are operatively coupled to all of the data ports of two memory devices 20.

In certain embodiments, the plurality of data handlers 28 comprises at least two physically separate components mounted on the PCB 12. For example, the plurality of data handlers 28 may include at least two physically separate integrated circuit packages. The physically separate integrated circuit packages are mounted on different portions of the PCB 12 in some embodiments. For example, each of the eight data handlers 30a-30h shown in FIG. 2 may include physically separate integrated circuit packages mounted on different portions of the PCB 12. While eight data handlers 30 are shown in FIG. 2, other numbers of data handlers 30 are possible including fewer or more than eight.

In certain embodiments, each of the plurality of data handlers 30 is positioned on the PCB 12 proximate to the corresponding plurality of data ports. For example, each data handler 30 of certain embodiments is positioned closer to the corresponding plurality of data ports 21 than the data handler 30 is to the other data ports 21 of the plurality of memory devices 18. For example, the data handler 30a is positioned closer to the corresponding plurality of data ports 21 of the memory device 40a than to the other data ports 21 of the other memory devices 40b-40h.

Figure 3:
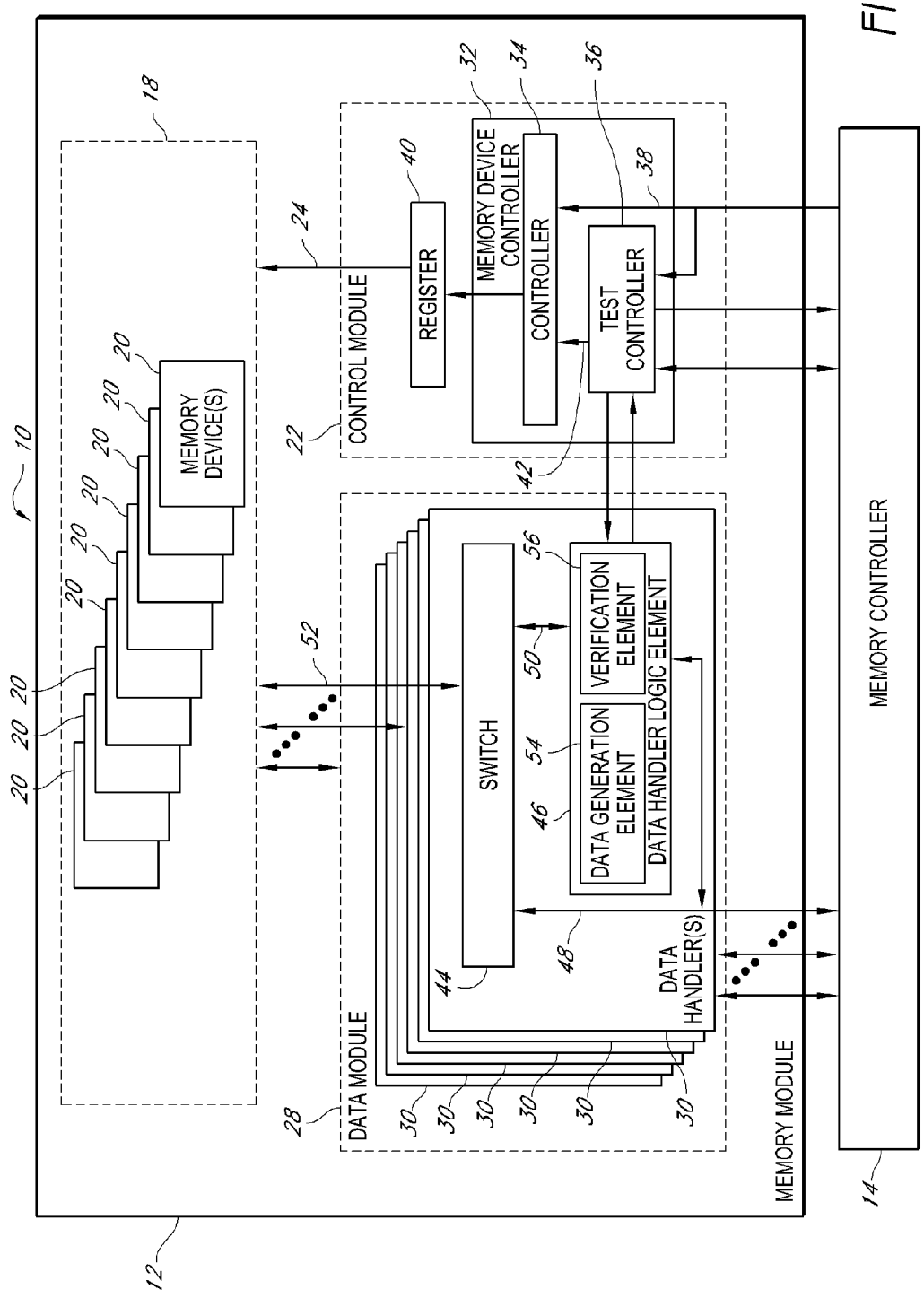
FIG. 3 is a block diagram of an example data handler module and an example control module in accordance with certain embodiments described herein.

FIG. 3 is a block diagram an example data module 28 and an example control module 22 in accordance with certain embodiments described herein. The control module 22 can be configured to generate address and control signals 24 for testing the plurality of memory devices 18. In some embodiments, the control module 22 includes a control mixer element 32. The control mixer element 32 may include a memory device controller 34 (e.g., a DRAM controller) and a test controller 36. In certain embodiments, the control mixer element 32 generally controls the address and the control signals for the self-testing function.

In certain embodiments, the memory device controller 34 generally pre-processes address and control information before it sends the information to a register 40. In one embodiment, the memory device controller 34 receives signals 38 (e.g., address and control signals) from the system memory controller 14 and signals 42 (e.g., address and controls signals) from the test controller 36. The control module 22 of certain embodiments is configured to selectively input to the address and control ports of the plurality memory devices 18 either the address and control signals 38 from the system memory controller 14 or the address and control signals 42 from the control module 22 (e.g., from the test controller 36). For example, the memory device controller 34 may send either the signals 38 from the system memory controller 14 or, alternatively, the signals 42 from the test controller 36, to the register 40 depending on whether the memory module 10 is in normal (non-test) mode or in a test mode, respectively. In one embodiment, the memory device controller 34 generates the address and control signals for memory device (e.g., DRAM device) operations. The test controller 36 controls the generation of the address and control signal sequences to be used during the self-testing operation of the memory module 10 and also communicates with the data module 28. The control module 22 may be implemented in the control register of the memory module 10 in certain embodiments. In various embodiments, the control module 22 includes discrete logic, one or more application-specific integrated circuit (ASICs), one or more microprocessors, one or more field-programmable gate arrays (FPGAs), or one or more computer-programmable logic device (CPLDs).

The data module 28 and the subcomponents thereof (e.g., the data handlers 30) may be in communication with one or more of the memory devices 20, the control module 22, and the memory controller 14. In certain embodiments, the data module 28 comprises a plurality of data handlers 30. In other embodiments the data module 28 includes at least one data handler 30. Each of the data handlers 30 of certain embodiments comprises a switch 44. For example, the switch 44 may include a data multiplexer/demultiplexer ("data mux/demux"). The switch 44 may provide a bi-directional data multiplexer function. In certain embodiments, the switch 44 is configured to selectively input to the corresponding plurality of data ports either data signals 48 from the system memory controller 14 or data signals 50 from the data handler logic element 46. The switch 44 of certain embodiments may further be configured to receive data signals 52 (e.g., during a read operation) from the plurality of memory devices 18 and to propagate the data signals 52 to the data handler logic element 46 and/or the memory controller 14. In some embodiments, for example, the switch 44 selectively inputs the data signals 48 to be written to the plurality of memory devices 18 from the system memory controller 14 when the memory module 10 is a normal (non-test mode) mode and, alternatively, inputs the data signals 50 from the data handler logic element 46 during a test mode. While the switch 44 is shown as being included in the data handler 30 in the example of FIG. 3, other configurations are possible. For example, in other embodiments the switch 44 may be logically and/or physically separated from the data handler module 28 and/or the data handlers 30.

Each of the data handlers 30 of certain embodiments further includes a data handler logic element 46. The data handler logic element 46 of certain embodiments comprises a data generation element 54 and a verification element 56. The data generation element 54 may be configured to generate data signals (e.g., patterns of data signals) for writing to the corresponding plurality of data ports, for example. The data signals and/or patterns of data signals may be based on information (e.g., programming or configuration information) the data handler logic element 46 receives from the control module 22, for example. The data may be cyclic data in some embodiments or non-cyclic data in other embodiments. For example, the cyclic data may comprise at least one predetermined pattern of data which repeats or is cycled two or more times. In various embodiments, the data comprises one or more incrementing patterns or decrementing patterns, for example. In other embodiments, the data comprises a pattern which alternates each bit on successive memory writes. For example, a memory write comprising one or more hexadecimal "A" characters (each corresponding to a four-bit binary word of "1010") may be followed by a memory write comprising one or more hexadecimal "5" characters (each corresponding to a four-bit binary word of "0101"). The data may be generated in a variety of ways. In one embodiment, the data is generated based on a current write address value. For example, in one example configuration, on a first write cycle, hexadecimal "A's" are generated and written to even address locations and hexadecimal "5's" are generated and written to odd address locations, and on a second write cycle, "5's" are written to even addresses and "A's" are written to odd addresses, and this pattern repeats in subsequent cycles. The data may be generated based previously written data (e.g., inverting each of the bits of a previously written data word) in some embodiments. In general, any manner of generating a cyclic or otherwise deterministic data pattern may be compatible with embodiments described herein. In other embodiments, random or pseudorandom data may be generated and written to the corresponding plurality of data ports. For example, a linear feedback shift register (LFSR) may be used in some embodiments. In addition, the data patterns may be programmable. For example, the data patterns may be programmable based on information received by the data generation element 54 from the memory controller 14 (e.g., through the control module 22), or from the control module 22.

The plurality of data handlers 30 are further configured to read data from the corresponding plurality of data ports. For example, the verification element 56 may be configured to receive data from the corresponding plurality of data ports (e.g., through the switch 44 during a test mode). The verification element 56 may further be configured to check for failures in the operation of the plurality memory devices 18 by verifying that data read from the corresponding plurality of data ports corresponds to the data generated by the data handler 30 and written to the corresponding plurality of data ports.

In certain embodiments, the verification element 56 is configured to perform the verification without storing a copy of the data written to the corresponding plurality of data ports or accessing a stored copy beyond the data read from the plurality of memory devices 18. For example, the verification element 56 does not store or access a copy of the data that is written to the corresponding plurality of data ports except for the data stored and read back from the plurality of memory devices 18. As such, the memory module 10 of certain embodiments advantageously does not require separate memory for storing duplicate copies of test data that is written to the plurality of memory devices 18 for later comparison. For example, the verification element 56 may calculate comparison data and may compares the comparison data to the data read from the corresponding plurality of data ports. In certain embodiments, the comparison data comprises data which expresses the data or values expected to be received from the plurality of memory devices 18 if the write, store, and read processes of the data using the data module 28 and the plurality of memory devices 18 are performed correctly or as expected. The calculation may be performed simultaneously or substantially simultaneously with receiving the data read from the corresponding plurality of data ports in certain embodiments. In other embodiments, the calculation is performed either before or after receiving the data. Other configurations are possible. For example, in one embodiment, the verification element 56 does store a separate copy of the data written to the corresponding plurality of data ports upon writing the data and compares the separate copy to the read data received from the plurality of memory devices 18.

The verification element 56 of certain embodiments calculates the comparison data based on the cyclic data. For example, in one embodiment, the verification element 56 calculates the comparison data in substantially the same manner that the data generation element 54 generates the data as described above (e.g., based on a current write address, using an LFSR, etc.). As such, the comparison data of certain embodiments is substantially a repeat of the data written. In one example embodiment, the data handler 30 is configured (e.g., is programmed by the control module 22) to write an alternating series of "A's" and "5's" to the data ports of the corresponding plurality of data ports as described herein. For example, the data handler 30 may be configured to write one or more "A's" to the first address location of an N-word memory device 20 including the corresponding plurality of data ports. The data handler 30 may then write one or more "5's" to the second address location, one or more "A's" to the third address location and so on until the data handler 30 has written to all N memory locations. The verification element 56 of the example embodiment then calculates the comparison data based on the cyclic data written to the corresponding plurality of data ports. For example, the verification element 56 calculates a comparison word including one or more "A's", "5's," and "A's," respectively, to be compared to the data read from the first, second, and third address locations based on the cyclic data (e.g., based on the known cycle of the data). In some embodiments, the comparison data is calculated based on a current read address.

In certain embodiments, data associated with failures in the operation of the plurality of memory devices 18 are stored in the data module 28. For example, data read from the corresponding plurality of data ports which do not correspond to (e.g., match) the comparison data calculated by the verification element 56 may be stored in the data module. Moreover, in some embodiments, memory addresses associated with the failures in the operation of the plurality of memory devices 18 are stored in the control module 22. For example, the data handler 30 may communicate data failures (e.g., when data read from the corresponding plurality of data ports does not correspond to calculated comparison data) to the control module 22 which may then store the addresses corresponding to the data failure. In certain embodiments, the memory module 12 is configured to report failures (e.g., the failed data, the address corresponding to the memory location of the failed data, and/or expected data) via the I²C interface 15 to the memory controller 14. In addition, in certain embodiments the test controller 36 and/or the data handlers 30 may be updated through the I²C interface 15 with new data patterns and/or with alternative memory access sequences to conduct AC tests (e.g., tests of the power, current, I/O speed, etc.).

In various embodiments, the components of the data module 28 (e.g., the switch 44, the data handlers 30, the data handler logic element 46, the data generation element 54, and/or verification element 56) may include discrete logic, one or more application-specific integrated circuits (ASICs) one or more microprocessors, one or more field-programmable gate arrays (FPGAs), or one or more computer-programmable logic devices (CPLDs). Additionally, one or more of the various functional blocks (e.g., the switch 44) of the data module 28 of FIG. 3 may not be included. In some embodiments, additional functional blocks may be included. Moreover, some of the functional blocks are described as separate functional blocks for illustration purposes and may comprise one physical component. For example, in one embodiment, each of the data handlers 30 and the corresponding switch 44, data generation element 54, and verification element 56 comprise one physical component (e.g., are included in one integrated circuit package). In another embodiment, the data module 28 comprises one physical component.

Referring again to FIG. 1, a self-testing memory module 10 of certain embodiments comprises a printed circuit board (PCB) 12 and is configured to be operatively coupled to a memory controller 14 of a computer system 16. The memory module 10 further includes a plurality of memory devices 18 on the printed circuit board 12 where each memory device 20 of the plurality of memory devices 18 comprising data, address, and control ports. The memory module 10 further comprises a control module 22 configured to generate address and control signals for testing the plurality of memory devices 18. In certain embodiments, the memory module 10 further comprises a data module 28 comprising at least one data handler 30 and operatively coupled to a corresponding plurality of the data ports of one or more of the memory devices 20. The data handler 30 is configured to generate cyclic data for writing to the corresponding plurality of data ports. In certain embodiments, there may be one data handler 30, for example. In other embodiments, there may be more than one data handler 30. The elements of the memory module 10 may be compatible with any of the embodiments described herein.

Figure 4:
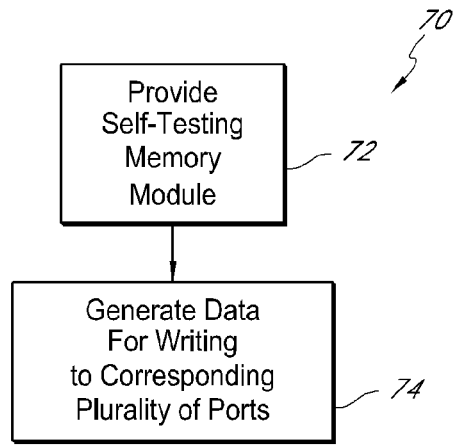
FIG. 4 is a flowchart of an example method of self-testing a memory module in accordance with certain embodiments described herein.

FIG. 4 is a flowchart of an example method 70 of self-testing a memory module 10 in accordance with certain embodiments described herein. While the method 70 is described herein by reference to the memory module 10, other memory modules, electronic systems or subsystems, and/or circuits are also compatible with the embodiments described herein. The method 70 of certain embodiments comprises providing a self-testing memory module 10 at operational block 72. The memory module 10 may comprise a printed circuit board (PCB) 12 configured to be operatively coupled to a memory controller 14 of a computer system 16. The memory module 10 may further comprise a plurality of memory devices 18 on the printed circuit board 12. Each memory device 20 of the plurality of memory devices 18 may comprise data, address, and control ports. The memory module 10 may comprise a control module 22 configured to generate address and control signals for testing the plurality of memory devices 18. The memory module 10 may further comprise a data module 28 comprising a plurality of data handlers 30. In certain embodiments, the data module 28 comprises at least one data handler 30. Each data handler 30 of certain embodiments is operable independently from each of the other data handlers 30 of the plurality of data handlers 28 and is operatively coupled to a corresponding plurality of the data ports. At operational block 74, the method 70 further comprises generating, by each of the data handlers 30, data for writing to the corresponding plurality of data ports.

Figure 5:
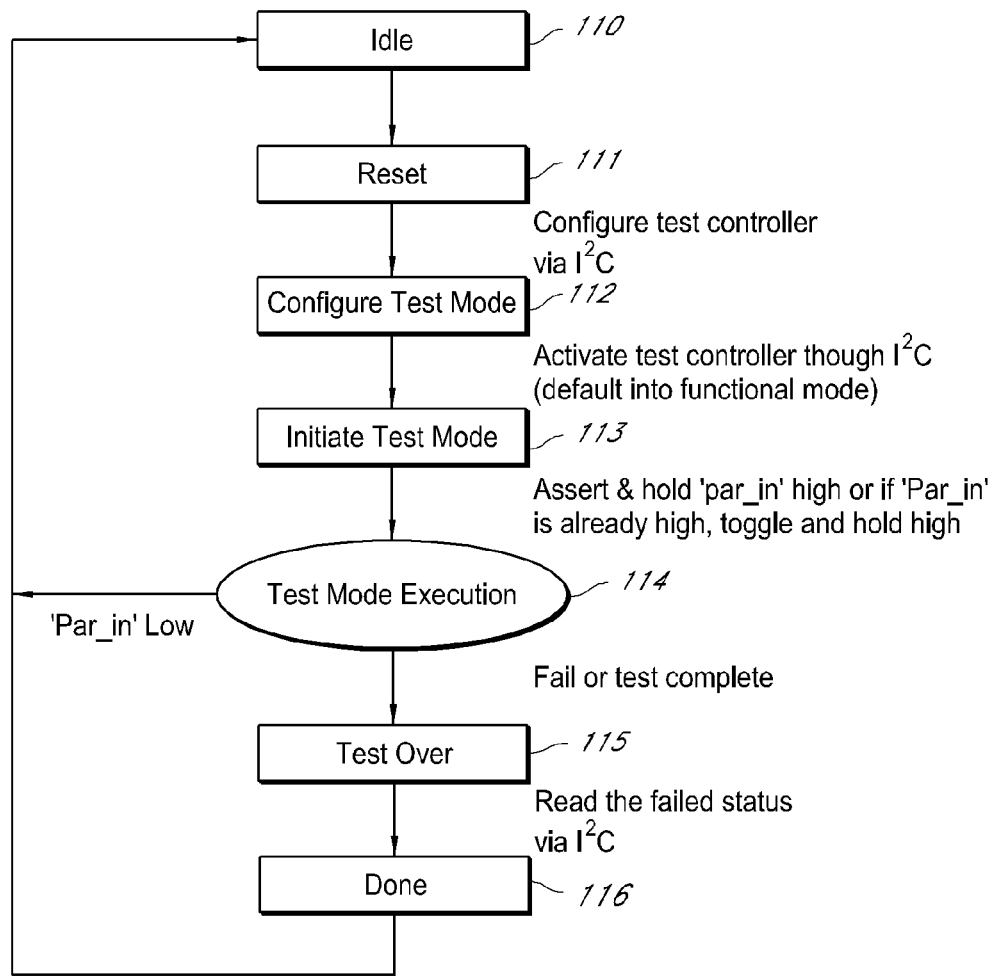
FIG. 5 is a flow diagram illustrating the self-testing operation of an example memory module in accordance with certain embodiments described herein.

FIG. 5 is a flow diagram 100 illustrating self-testing operation of an example self-testing memory module 10 in accordance with certain embodiments described herein. At operational block 110 the memory module 10 enters an idle state after power up or, in some embodiments, when the memory board of the computer system 16 is connected to a mother board or to a test board. In one embodiment, at operational block 110, the contents of the register 40 are undefined and the controllers (e.g., the test controller 36 and the memory device controller 34) are in unknown state. After power up, the memory module 10 is reset (e.g., a reset command is executed) at operational block 111. At operational block 111, the logic of the data handler 30 (e.g., data generation element 54 and/or verification element 56) and the logic of the control mixer 32 are set to default values and/or states. For example, the memory module 10 may default to a non-test mode (e.g., normal operational mode) and the switches 44 of the data handlers 30 and the memory device controller 34 are not configured in a test mode. At operational block 112, the test mode is configured. For example, the computer system 16 (e.g., through the memory controller 14) may configure the test mode. The configuration may be through the I²C interface 15, for example, and may include configuring the test controller 36 for test mode. For example, configuring the test mode may include switching (e.g., by configuring the test controller 36) the mode of the memory module 10 from a normal operation mode to the test mode.

At operational block 113, the test mode is initiated. Initiating the test mode may comprise configuring a particular test case (e.g., particular test data or data patterns, particular write and/or read address sequences, etc.). The initiation may be achieved by activating the test controller 36 to initiate the test mode. For example, at operational block 113, the data handlers 30 and the control mixer 32 are readied (e.g., via a tester) beginning the self-testing of the memory module 10. For example, the tester may comprise an ATM tester, a server, a specialized tester. The tester may ready the data handlers 30 and the control mixer through the I²C interface 15 or through the control signals 38, for example. For example, the data handlers 30 are configured to input data generated by the data handlers 30 to the corresponding plurality of data ports of the plurality of memory devices 18 and the control mixer 32 is configured to input address and control signals from the test controller 36 to the plurality of memory devices 18. At operational block 113 the test controller 36 updates each of the data handlers 30 (e.g., with new data patterns, write signal characteristics, etc.).

In one embodiment, the input signal on a pin (e.g., a parity-in pin) of the memory module 10 is asserted or toggled (e.g., by the memory controller 14). For example, if the parity-in signal ("Par-in") is un-asserted (e.g., set to a "low" value), it is asserted (e.g., set to a "high" value) and held in the asserted state. Alternatively, if the parity-in signal is already in the asserted state, it may be toggled and then held in the asserted state. The memory module 10 executes the test mode (e.g., writes and reads test data patterns) at operational block 114. The memory module 10 continues executing the test mode at operational block 114 until the self-test is complete or until the memory module 10 detects a certain number of memory failures such that a failure count exceeds a preset number.

If the failure count exceeds the preset number, the memory module 10 enters operational block 115 and "errors out" of the test mode. If the self-test is completed at operational block 114 and the failure count does not exceed the preset number, the memory module 10 enters operational block 115. At operational block 115, the memory module 10 sends out a test completion indication signal (e.g., through the test controller 36 to the memory controller 14). At operational block 116, the fail status of the test may be read out through, for example, the I²C interface 15. For example, one or more address values associated with failed memory locations, and/or the data read from those locations, and/or expected data may be read. In other cases, where the test fails, the memory module 10 may report the failure to the memory controller 14 through any available signal (e.g., bidirectional data or data strobe signal) between the memory module 10 and the memory controller 14.

In some embodiments, the memory module 10 is generally interruptible. For example, the memory module 10 may exit the self-test and return to operational block 110 if the signal going into the parity-in pin is, for example, de-asserted or removed at operational block 155. In other embodiments, the interrupt signal or condition may be different and may not be a parity-in signal. For example, in one embodiment, the memory module 10 may exit the self-test and return to operational block 110 if a timer having a pre-determined count expires. When the self-testing is interrupted, the memory module 10 will return to operational block 110 and the bit failure information in the control mixer 32 and the data handler 30 becomes invalid.

Figure 6:
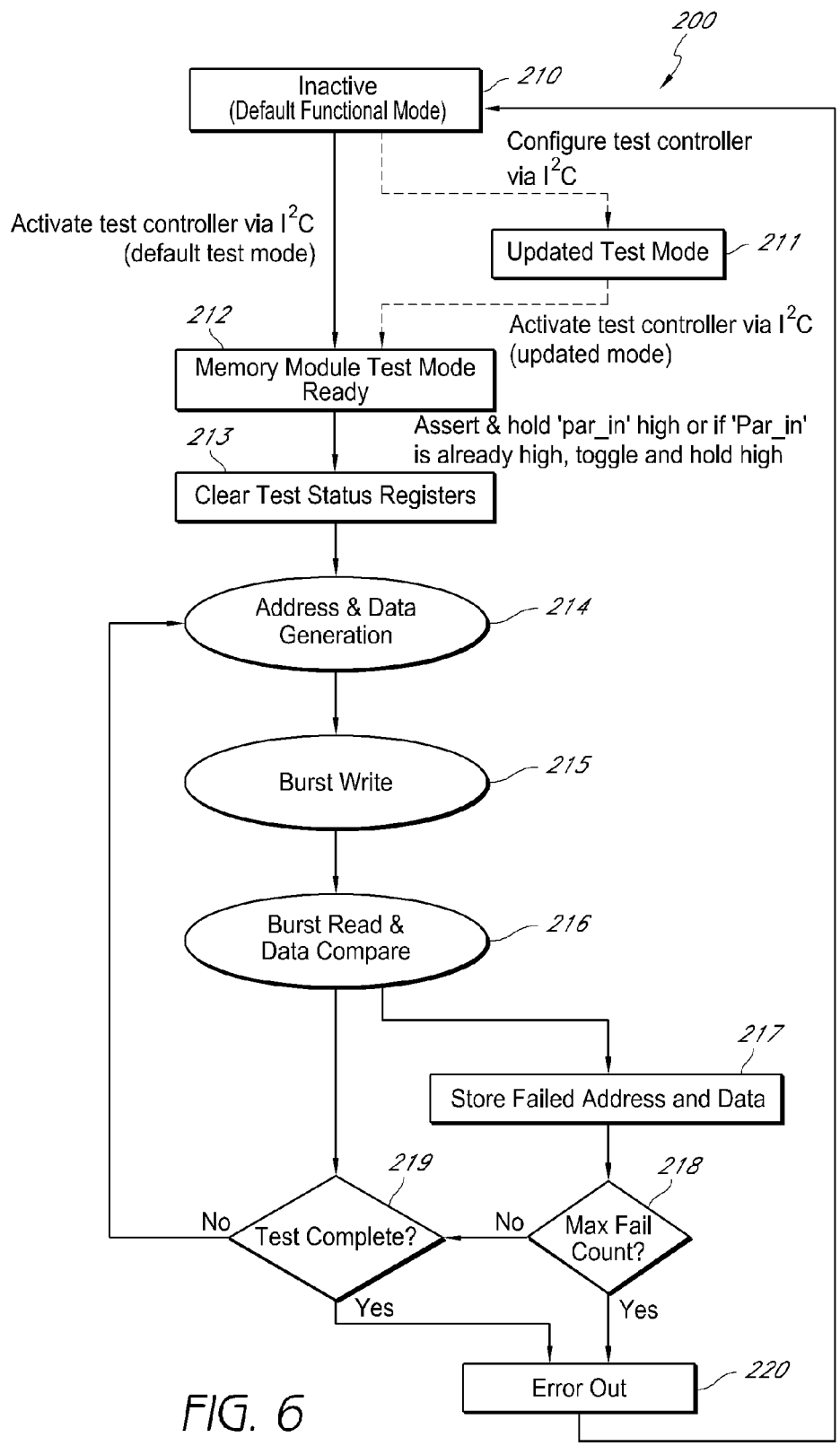
FIG. 6 is a flow diagram illustrating the self-testing operation of an example memory module in accordance with certain embodiments described herein.

FIG. 6 is a flow diagram 200 illustrating the operation of an example self-testing memory module 10 in accordance with certain embodiments described herein. For example, one or more of the operational blocks of the flow diagram 200 of FIG. 6 may correspond to one or more of the operational blocks of FIG. 5. At operational block 210, the memory module 10 may be generally inactive. For example, the testing logic (e.g., the control module 22 and/or the data module 28) may be generally inactive and the memory module 10 may default to a functional (e.g., non-test) mode. In certain embodiments, the memory module 10 executes one or more tasks which configure the self-test mode of the self-testing memory module using an I²C interface 15. For example, the memory module 200 may configure the test controller 36 through the I²C interface 15 (e.g., as described with respect to FIG. 5). In other embodiments, the test mode is configured using the control signals 38. For example, the test mode may be updated at operational block 211 in certain embodiments. In certain embodiments, updating the test mode comprises programming the test controller 36 with test configuration information such as test data patterns, test data sequences, test failure conditions, etc. After updating the test mode at operational block 211, the test controller 36 may then be activated through the I²C interface 15 (e.g., as described with respect to FIG. 5) in certain embodiments. Alternatively, as shown, the test controller 36 may be activated through the I²C interface 15 without first updating the test mode.

At operational block 212, the memory module test mode is ready for execution. In one embodiment, the input signal on a pin (e.g., a parity-in pin) of the memory module 10 is asserted or toggled (e.g., by the memory controller 14). For example, if the parity-in signal is low, it is asserted (e.g., set to a "high" value) and held in the asserted state. Alternatively, if the parity-in signal is already in the asserted state, it may be toggled and then held in the asserted state. At operational block 113, a set of status registers (e.g., one or more registers of the control module 22 or the data module 28) are cleared.

The memory module 200 generates address and data signals for testing the plurality of memory devices 18 at operational block 214. For example, the data generation elements 54 of the data handlers 30 may generate the data for writing to the plurality of memory devices 18 as described herein. In addition, the control module 22 may generate address and control signals for testing the plurality of memory devices 18 as described herein. At operational block 215, the memory module 10 performs a burst write function. For example, in certain embodiments, the memory module 10 writes multiple memory locations in the memory module 10 that are to be tested at operational block 215 in a relatively short amount of time (or in a burst). In certain embodiments, the memory module 10 can perform multiple write bursts at operational block 215. Next, at operational block 216, the memory module 10 performs a read & compare function. For example, in certain embodiments, the memory module 10 reads back certain memory locations at operational block 216 that have been written at operational block 215 and compares the values with certain expected data. For example, a verification element 56 of each of the data handlers 30 may calculate the expected data and/or compare the values as described herein. In some embodiments, the memory module 200 reads from multiple memory locations in the memory module 10 in a relatively short amount of time (or in a burst). In certain embodiments, the memory module 10 can execute multiple read bursts at operational block 216 as it compares the read data with expected data. In some embodiments, the memory module 200 (e.g., the data handlers 30 of the memory module 200) stores any failed read data and the associated expected data at operational block 217. In some embodiments, the memory module sends one or more failure indications to the memory controller 14 over one or more available signals between memory module 10 and the memory controller 14. For example, the I²C interface 15 or one or more bi-directional data pins (e.g., one or more of the data pins 48) may be used.

The memory module 200 stores the addresses of the memory locations associated with the failed read data using the test controller 32 at operational block 217. In other embodiments the failed read data, expected data, and the addresses of the memory locations associated with the failed read data may be stored using the test controller 32. For example, in one embodiment, the test controller 32 stores the failed read data, expected data, and the addresses of the memory locations associated with the failed read data at operational block 217. In some embodiments, the test controller 32 is generally inaccessible through the I²C interface 15 during self-test operation. For example, the test controller is inaccessible through the I²C interface 15 until a test failure occurs at operational block 217 or until the test completes at operational block 219. In some embodiments, when the test is complete, the test results can be read out of the memory module 10 (e.g., through the I²C interface 15). In some cases, the test can be interrupted using the I²C interface 15 or using the parity-in signal (e.g., by de-asserting the parity-in signal).

Although certain preferred embodiments and examples are discussed above, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. A memory system configured to be operatively coupled to a memory controller of a computer system, the memory system comprising:
 a plurality of memory chips;
 a plurality of data handlers configured to be operated independently from one other, wherein one or more data handlers of the plurality of data handlers are configured to generate data for writing to a corresponding one or more memory chips of the plurality of memory chips;
 a control circuit configured to generate address and control signals, wherein the memory system is configured to test the one or more memory chips using the address and control signals generated by the control circuit and using the data generated by the one or more data handlers.

2. The memory system of claim 1, wherein each of the one or more memory chips comprises address and control ports configured to receive the address and control signals generated by the control circuit and data ports configured to receive the data generated by the one or more data handlers.

3. The memory system of claim 2, wherein the one or more data handlers are positioned closer to the data ports of the one or more memory chips than to data ports of other memory chips of the plurality of memory chips.

4. The memory system of claim 1, wherein the memory system comprises at least two physically separate integrated circuit packages, wherein each of the at least two physically separate integrated circuit packages comprises at least one data handler of the plurality of data handlers.

5. The memory system of claim 1, wherein the memory system is configured to test the one or more memory chips by writing the data generated by the one or more data handlers to one or more memory locations of the one or more memory chips.

6. The memory system of claim 5, wherein the one or more data handlers are further configured to receive data from the one or more memory chips and to identify failures in the operation of the one or more memory chips by verifying that data received from the one or more memory locations of the one or more memory chips corresponds to the data generated and written by the one or more data handlers to the one or more memory locations of the one or more memory chips.

7. The memory system of claim 6, wherein the one or more data handlers are further configured to verify that the data read from the one or more memory locations of the one or more memory chips corresponds to the data generated and written by the one or more data handlers to the one or more memory locations of the one or more memory chips without storing a copy of the data generated and written by the one or more data handlers.

8. The memory system of claim 6, wherein the one or more data handlers are configured to calculate comparison data and to compare the comparison data to the data read from the one or more memory locations of the one or more memory chips.

9. The memory system of claim 5, wherein the control circuit is further configured to store memory addresses associated with failures in the operation of the one or more memory locations of the one or more memory chips.

10. The memory system of claim 5, wherein the memory system is further configured to store data associated with failures in the operation of the one or more memory locations of the one or more memory chips.

11. The memory system of claim 1, wherein the data generated by the one or more data handlers for writing to the one or more memory chips comprises cyclic data.

12. The memory system of claim 11, wherein the one or more data handlers are further configured to calculate comparison data based on the cyclic data and to compare the comparison data to data read from the one or more memory locations of the one or more memory chips.

13. The memory system of claim 1, wherein the one or more data handlers are further configured to calculate comparison data based on a current read address and to compare the comparison data to data read from the one or more memory locations of the one or more memory chips.

14. The memory system of claim 1, wherein the one or more circuits are further configured to write data to the one or more memory chips by selectively inputting to the one or more memory chips either data signals from the memory controller of the computer system or data signals from the one or more circuits.

15. The memory system of claim 1, wherein the control circuit is further configured to selectively input to the address and control ports of the one or more memory chips either the address and control signals from the memory controller of the computer system or the address and control signals from the control circuit.

16. A method of operating a memory system configured to be operatively coupled to a memory controller of a computer system, the memory system having a plurality of memory chips, the method comprising:
 operating a plurality of data handlers independently from one another to generate and transmit data to one or more memory locations of one or more memory chips of the plurality of memory chips;
 operating a control circuit to generate address and control signals; and
 testing the one or more memory locations of the one or more memory chips using the address and control signals generated by the control circuit and using the data generated by the plurality of data handlers.

17. The method of claim 16, further comprising:
 receiving, by the plurality of data handlers, data from the one or more memory locations of the one or more memory chips; and
 verifying that the data received from the one or more memory locations of the one or more memory chips corresponds to the data transmitted to the one or more memory locations of the one or more memory chips.

18. The method of claim 17, wherein said verifying is performed without storing a copy of the data transmitted to the one or more memory locations of the one or more memory chips.

19. The method of claim 17, wherein said verifying comprises:
 calculating comparison data; and
 comparing the comparison data to the data received from the one or more memory locations of the one or more memory chips.

20. The method of claim 17, wherein the data transmitted to the one or more memory locations of the one or more memory chips comprises cyclic data.

* * * * *